United States Patent
Shiikuma

(10) Patent No.: US 7,315,207 B2
(45) Date of Patent: Jan. 1, 2008

(54) DOHERTY AMPLIFIER AND ITS DISTORTION CHARACTERISTIC COMPENSATION METHOD

(75) Inventor: Kazumi Shiikuma, Minato-ku (JP)

(73) Assignee: NEC Corporation, Tokyo (JP)

( * ) Notice: Subject to any disclaimer, the term of this patent is extended or adjusted under 35 U.S.C. 154(b) by 209 days.

(21) Appl. No.: 10/542,288

(22) PCT Filed: Dec. 22, 2003

(86) PCT No.: PCT/JP03/16444

§ 371 (c)(1),
(2), (4) Date: Jul. 15, 2005

(87) PCT Pub. No.: WO2004/066489

PCT Pub. Date: Aug. 5, 2004

(65) Prior Publication Data

US 2006/0114064 A1    Jun. 1, 2006

(30) Foreign Application Priority Data

Jan. 17, 2003   (JP) .............................. 2003-009678

(51) Int. Cl.
    *H03F 3/68*   (2006.01)
(52) U.S. Cl. .................. 330/124 R; 330/295
(58) Field of Classification Search ............... 330/53, 330/124 R, 286, 295
    See application file for complete search history.

(56) References Cited

U.S. PATENT DOCUMENTS 6,639,464 B2 * 10/2003 Hellberg ................ 330/124 R 2004/0113698 A1 * 6/2004 Kim et al. ................ 330/295

FOREIGN PATENT DOCUMENTS

| JP | 5-28112 U | 4/1993 |
| JP | H07-022852 A | 1/1995 |
| JP | H08-330873 A | 12/1996 |
| JP | 10-20977 A | 1/1998 |
| JP | H10-513631 A | 12/1998 |
| JP | H11-145734 A | 5/1999 |
| JP | 2001-518731 A | 10/2001 |
| JP | 2002-124840 A | 4/2002 |
| JP | 2002-510927 A | 4/2002 |
| JP | 2003-037451 A | 2/2003 |
| JP | 2003-516013 A | 5/2003 |

(Continued)

OTHER PUBLICATIONS

Kawakami Masamitsu, "Electronic Circuit II", Kyoritsu Syuppan Co., Ltd, Jan. 20, 1955, p. 166-169.

(Continued)

*Primary Examiner*—Khanh Van Nguyen
(74) *Attorney, Agent, or Firm*—Sughrue Mion, Pllc.

(57) ABSTRACT

Pre-distortion compensation circuits (11, 12) are disposed at stages previous to carrier amplifier 13 and peak amplifier 14, respectively. Pre-distortion compensation circuit (11) has such characteristics that compensate carrier amplifier (13) for a distortion characteristically produced on the operation thereof, particularly, an amplitude-phase (AM-PM) distortion, while pre-distortion compensation circuit (12) has such characteristics that compensate peak amplifier (14) for a distortion characteristically produced on the operation thereof, particularly, an AM-PM distortion. Thus, the Doherty amplifier is also compensated for its own AM-PM distortion characteristic to accomplish a low distortion characteristic and implement an ideal power combining operation thereof.

4 Claims, 5 Drawing Sheets

FOREIGN PATENT DOCUMENTS

WO       WO 01/39367 A1       5/2001
WO       WO 02/095933 A1       11/2002

OTHER PUBLICATIONS

W. H. Doherty, "A New High Efficiency Power Amplifier for Modulated Waves," Proc. IRE, vol. 24, No. 9, Sep. In 1936.

Peter B. Kennington, "High-Linearity RF Power Amplifier Design", p. 351-420, p. 493-506, Artech House, 2000.

N. Imai, et al., "Novel Linearizer Using Balanced Circulators and Its Application to Multilevel Digital Radio Systems," IEEE Trans. Microwave Theory and Techniques, vol. 37, No. 8, Aug. 1989.

* cited by examiner

DOHERTY AMPLIFIER AND ITS DISTORTION CHARACTERISTIC COMPENSATION METHOD

TECHNICAL FIELD

The present invention relates to a Doherty amplifier which comprises two amplifiers, that differ in operation class from each other, to enable accomplishment of highly efficient amplification.

BACKGROUND ART

Due to an explosive proliferation of a portable terminal market in recent years and improvements in the infrastructure associated therewith, more strict requirements have been made from the market for improvements on the efficiency of transmission amplifiers for base stations as well as transmission amplifiers for mobile stations. For this reason, attention has been focused in recent years on the trend of accomplishing a high-performance amplifiers by combining a technology of amplifying signals at high efficiency, as represented by the Doherty amplifier, with a technology of reducing distortions and a recent distortion compensation technology (see, for example, the following Documents 1-6).

Document 1: JP-2002-124840-A

Document 2: JP-7-22852-A

Document 3: JP-8-330873-A

Document 4: Published Japanese Translation of PCT International Publication for Patent Application No. 2001-518731

Document 5: Published Japanese Translation of PCT International Publication for Patent Application No. 2002-510927

Document 6: Published Japanese Translation of PCT International Publication for Patent Application No. 10-513631

The Doherty amplifier is a device intended to improve the efficiency of high-output power amplifier, and was first proposed in the following Document 7. The Doherty amplifier generally comprises a carrier amplifier and a peak amplifier which are implemented by devices having the same characteristics, and is composed of two to a plurality of them in parallel. A large number of Doherty amplifiers have been implemented as amplifiers which actually handle signals over frequency bands from low frequencies to millimeter waves.

Document 7: W. H. Doherty "A New High Efficiency Power Amplifier for Modulated Waves", Proc. IRE, Vol. 24, No. 9, September. in 1936

The configuration of such a conventional Doherty amplifier is illustrated in FIG. 1. As illustrated in FIG. 1, this conventional Doherty amplifier comprises carrier amplifier 13 which is performing at all times a signal amplifying operation irrespective of an input signal level; peak amplifier 14 which performs an amplifying operation only during a high power output event in which an input signal level is equal to or higher than a certain level; output combiner circuit 15 for combining the output of carrier amplifier 13 with that of peak amplifier 14 to deliver the resulting output; and an input branching circuit 10 for distributing an input signal to a carrier amplifier 13 and to a peak amplifier 14. Peak amplifier 14 may be called an "auxiliary amplifier," but the name "peak amplifier" is always used in this specification.

Generally, the Doherty amplifier has carrier amplifier 13 which operates while maintaining the saturation near the saturated output power to accomplish a higher efficiency than general class-A and class-AB amplifiers even when a backoff is removed from the saturated power for delivery. An amplifier biased to class AB or class B is often used as carrier amplifier 13. Also, peak amplifier 14 is often biased to class C in use such that it operates only when a high-power signal is generated.

Here, the backoff refers to the difference between average output power and saturated power, and a large backoff state shows a state in which the average output power is smaller as compared with the saturated power.

Output combiner circuit 15, which combines the output of carrier amplifier 13 with that of peak amplifier 14, is comprised of a transformer, and is generally implemented by a transmission line of one-quarter wavelength (¼ λ).

Input branching circuit 10 is comprised of a transmission line of one-quarter wavelength or a 90° hybrid circuit or the like for making a phase relationship between an output signal of peak amplifier 14 and an output signal of carrier amplifier 13 in phase at a signal combining point of output combiner circuit 15.

Since the operation principles of general Doherty amplifiers, specific examples of pre-distortion compensation circuits, and the like are well known to those skilled in the art, for example, from the following Document 8 and the like, their detailed configurations are omitted:

Document 8: Peter B. Kenington, "High-Linearity RF Power Amplifier Design", P.351-420, P493-506, Artech House, 2000.

In the following, a description will be given of the operation of this conventional Doherty amplifier. To begin with, the operation of carrier amplifier 13 will be described. Generally, an amplifier suffers from an amplitude-amplitude distortion (hereinafter abbreviated as AM-AM) and amplitude-phase (hereinafter abbreviated as AM-PM) distortion as an operating point moves from a linear region to a saturation region, and causes a deviation (distortion) from a linear response, an example of which is shown in FIG. 2. This distortion appears more prominent as the operating point exceeds the saturation point of the amplifier and goes deeper into a compression region, and constitutes one cause for generating a distortion component such as cross-modulation, adjacent leak power and the like in a signal band and its vicinity.

Next, consider operating states of each of carrier amplifier 13 and peak amplifier 14 during the operation of the Doherty amplifier. Note that while a situation is assumed herein in which the same devices are used for both carrier amplifier 13 and peak amplifier 14 for simplicity, it is believed that the generality is not particularly lost.

The operation region of the Doherty amplifier is roughly divided into three operation regions: a low level region, a transition region, and a saturation region. In a region in which lower input power is applied to the Doherty amplifier (called a "low-level region"), peak amplifier 14 is biased to class C and is therefore cut off, so that it is not operating. On the other hand, carrier amplifier 13 is performing a normal amplifying operation. Then, as the input power gradually increases, carrier amplifier 13 reaches the saturation immediately before peak amplifier 14 starts the operation (this is called the "transition point"). At this time, the efficiency of the Doherty amplifier itself is maximized, and its efficiency increases to approximately 78% if carrier amplifier 13 is an ideal class-B amplifier. However, at this time, saturated output power of carrier amplifier 13 is still one quarter of saturated power which should be generated as the Doherty amplifier.

Further, as the input power increases, peak amplifier 14 now starts the operation, i.e., starts a signal amplifying operation as a class-C amplifier, and modulates a load impedance of carrier amplifier 13 through a transmission line transformer disposed in output combiner circuit 15. Carrier amplifier 13, while maintaining the saturated state, supplies larger power to a load which is modulated in accordance with the output power of peak amplifier 14. Thus, a linear amplification characteristic is maintained as the Doherty amplifier as a result, making it possible to generate desired saturated power. The amplifier efficiency is maintained extremely high from this transition point to the saturation point.

Next, the AM-PM distortion characteristic for the input level of the Doherty amplifier will be described with reference to FIG. 3. FIG. 3 schematically shows the AM-PM distortion characteristics of carrier amplifier 13, peak amplifier 14, and the overall Doherty amplifier with respect to the input level. In FIG. 3, curve A represents the AM-PM distortion characteristic of carrier amplifier 13; curve B represents the AM-PM distortion characteristic of peak amplifier 14; and curve C represents the AM-PM distortion characteristic of the Doherty amplifier.

In a transition region, carrier amplifier 13 performs an amplifying operation while maintaining the saturation, as described above, so that the AM-PM distortion becomes larger as the input level increases, as indicated by curve A in FIG. 3. However, as indicated by curve B in FIG. 3, peak amplifier 14 does not yet reach the saturation at this time, but is operating at an operating point at which a large backoff is present, so that its AM-PM distortion is relatively small. Also, since peak amplifier 14 does not significantly contribute to the output power of the Doherty amplifier, its AM-PM distortion can be almost ignored from the total AM-PM distortion characteristic. Note that the AM-PM distortions from the respective amplifiers need not be generated in different directions (signs) as in FIG. 3.

Next, considering a situation in which the input power is further increased so that the Doherty amplifier is generating saturated power, carrier amplifier 13 is maintaining the saturated state, and peak amplifier 14 also reaches the saturated state this time, so that the AM-PM distortion further increases as well in peak amplifier 14. It is therefore understood that the AM-PM distortions of carrier amplifier 13 and peak amplifier 14 differ in the level at which the distortion occurs, depending on the input power, i.e., the operating state of the Doherty amplifier.

While a high efficiency can be accomplished by the conventional Doherty amplifier as described above, a problem lies in that the AM-PM distortion grows as the input power is increased. A method generally contemplated for compensating such an amplifier for the AM-PM distortion characteristic may involve disposing a pre-distortion compensator at a stage previous to the amplifier.

As an amplifier which places emphasis on distortion, a plurality of identical amplifiers are often arranged in parallel to generate respective outputs which are combined to produce large power. In an amplifier in such a configuration, since each of the amplifiers is adjusted to a substantially similar characteristic, the respective amplifiers are basically identical in the total characteristics as well. A number of examples are found in documents and the like as to attempts to compensate such an amplifier for distortion by providing a common pre-distortion compensator for the amplifier. For example, as described in the following Document 9, such attempts are not uncommon. In this event, an almost satisfactory distortion compensation characteristic can be achieved for each of the amplifiers operated in parallel. Generally, however, they are operated while a predetermined backoff is ensured, so that they are limited to a low value in regard to the efficiency.

Document 9: N. Imai et. Al. "Novel Linearizer Using Balanced Circulators and Its Application to Multilevel Digital Radio Systems" IEEE Trans. Microwave Theory and Techniques Vol. 37, No. 8, August 1989.

A certain degree of distortion improving effects can be expected for the Doherty amplifier as well by using a pre-distortion compensation circuit which is configured to compensate the Doherty amplifier for the total AM-PM distortion characteristics just like the prior art. However, for improving the efficiency of the Doherty amplifier, since carrier amplifier 13 and peak amplifier 14 differ in the operation class, there is a difference in the level of generated AM-PM distortion depending on input power, i.e., an operating point and an operating state. For this reason, the uniform compensation relying on the pre-distortion compensation circuit, as the prior art, is not always the best solution. Specifically, when the Doherty amplifier is regarded as a single amplifier and a pre-distortion compensation is attempted therefor, an optimal AM-PM compensation is not always achieved in each of carrier amplifier 13 and peak amplifier 14, thus failing to provide optimal distortion compensation effects and ideal operations as the Doherty amplifier. Also, there is a problem in that a phase difference is not compensated for at an output combining point, thus failing to achieve an ideal power combining operation.

In other words, the conventional Doherty amplifier and associated distortion characteristic compensation method described above have a problem of the inability to reduce distortions such as the AM-PM distortion because the Doherty amplifier is composed of a carrier amplifier and a peak amplifier which differ in the operation class, though a high efficiency can be accomplished.

DISCLOSURE OF THE INVENTION

It is an object of the present invention to provide a Doherty amplifier which is capable of accomplishing an ideal power combining operation with a further reduction in generated AM-PM distortion, and an associated distortion characteristic compensation method.

To achieve the above object, a Doherty amplifier according to the present invention has:

a carrier amplifier which is performing a signal amplifying operation at all times irrespective of an input signal level;

a peak amplifier which performs an amplifying operation only when the input signal level increases to a certain level or higher to generate high power;

an output combiner circuit for combining the outputs of the carrier amplifier and the peak amplifier to deliver a combined output; and an input branching circuit for distributing an input signal to the carrier amplifier and to the peak amplifier, wherein the Doherty amplifier is characterized by comprising one or both of:

a first pre-distortion compensation circuit disposed at a stage previous to the carrier amplifier and having such characteristics that compensate the carrier amplifier for a distortion characteristically produced on the operation of the carrier amplifier; and a second pre-distortion compensation circuit disposed at a stage previous to the peak amplifier and having such characteristics that compensate the peak amplifier for a distortion characteristically produced on the operation of the peak amplifier.

According to the present invention, since the Doherty amplifier is provided with the first and second pre-distortion compensation circuits having such characteristics that compensate the respective associated amplifiers for distortions characteristically produced on the operations thereof, respectively, at the stages previous to the carrier amplifier and peak amplifier, the carrier amplifier and peak amplifier can be compensated for the distortion characteristics independently of each other. It is therefore possible to reduce the distortion at the output of the Doherty amplifier which can perform a highly efficient amplifying operation and to implement an ideal power combining operation as the Doherty amplifier.

Also, in the Doherty amplifier according to the present invention, the distortions compensated for by the first and second pre-distortion compensation circuits are amplitude-phase (AM-PM) distortions.

BEST MODE FOR CARRYING OUT THE INVENTION

Next, one embodiment of the present invention will be described in detail with reference to the drawings.

Figure 4:
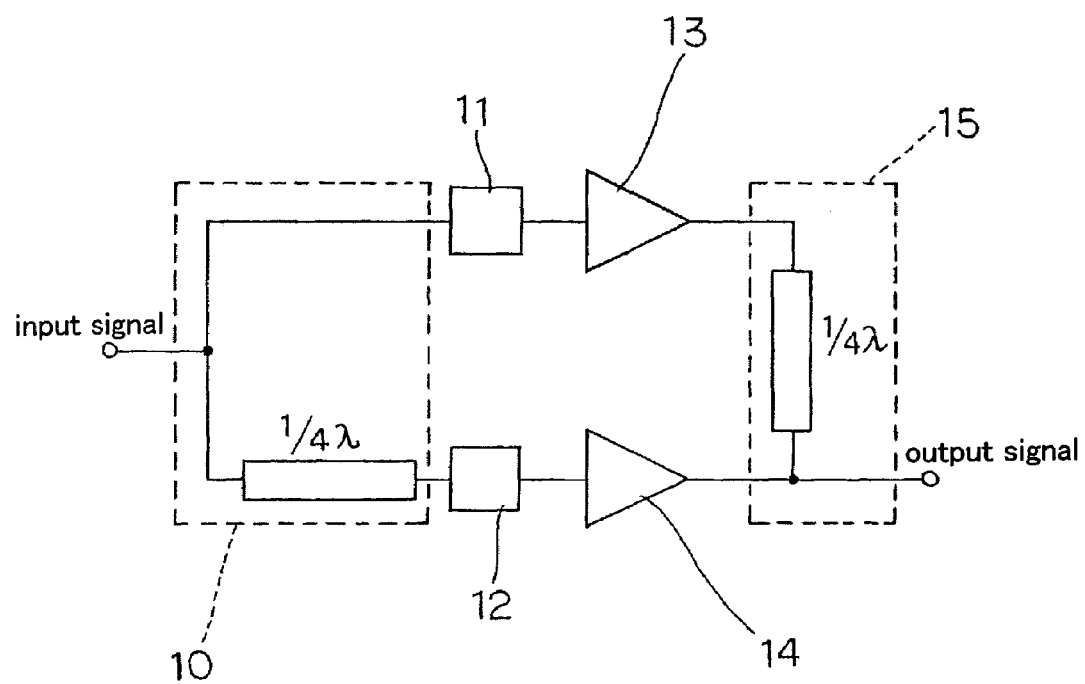
FIG. 4 is a circuit diagram illustrating the configuration of a Doherty amplifier according to one embodiment of the present invention.

FIG. 4 is a block diagram illustrating the configuration of a Doherty amplifier according to one embodiment of the present invention. In FIG. 4, components identical to the components in FIG. 1 are designated the same reference numerals, and description is omitted.

Figure 1:
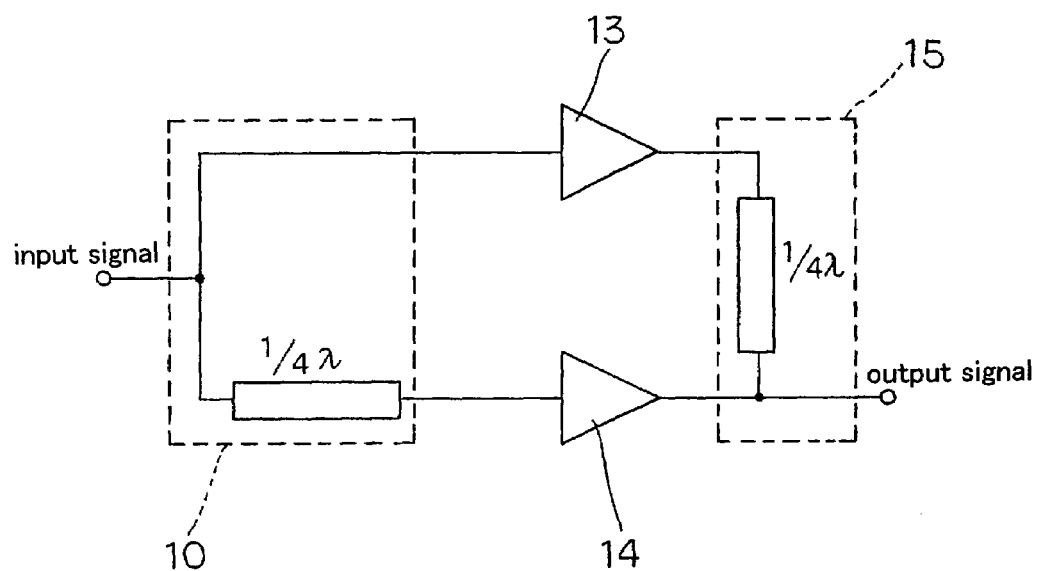
FIG. 1 is a block diagram illustrating the configuration of a conventional Doherty amplifier.
Figure 2:
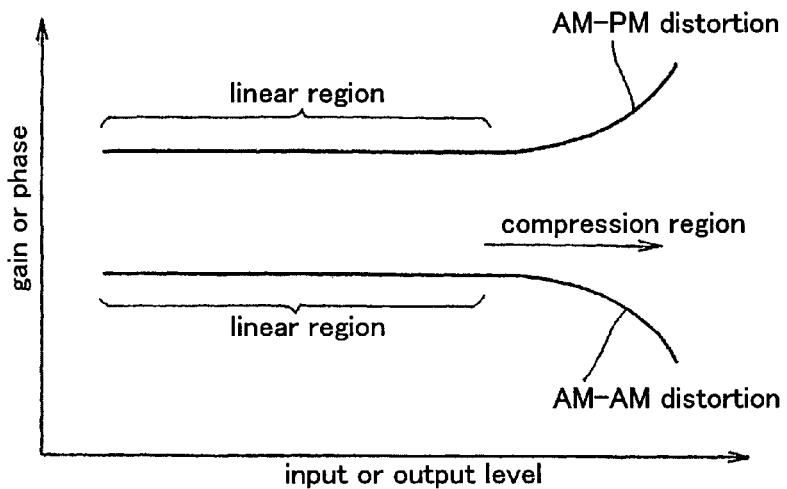
FIG. 2 is diagram showing examples of general AM-AM distortion and AM-PM distortion.
Figure 3:
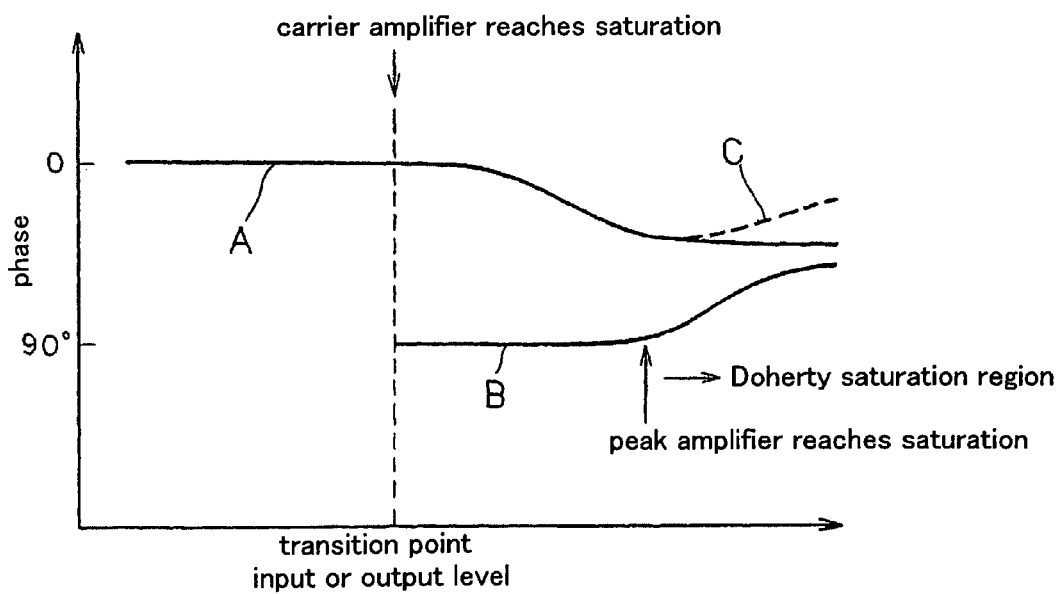
FIG. 3 is a diagram schematically showing AM-PM distortion characteristics of carrier amplifier 13, peak amplifier 14, and an overall Doherty amplifier with respect to an input level.

The Doherty amplifier of this embodiment comprises pre-distortion compensation circuit 11 at a stage previous to carrier amplifier 13, and pre-distortion compensation circuit 12 at a stage previous to peak amplifier 14 in addition to the conventional Doherty amplifier illustrated in FIG. 1.

Pre-distortion compensation circuit 11 has such characteristics that compensate carrier amplifier 13 for distortions characteristically produced on the operation of carrier amplifier 13, particularly, an amplitude-phase (AM-PM) distortion, while pre-distortion compensation circuit 12 has such characteristics that compensate peak amplifier 14 for distortions produced characteristically on the operation of peak amplifier 14, particularly, an AM-PM distortion. In other words, pre-distortion compensation circuit 11 has been previously set in accordance with the distortion characteristic of carrier amplifier 13, while pre-distortion compensation circuit 12 has been previously set in accordance with the distortion characteristic of peak amplifier 14.

By disposing pre-distortion compensation circuits 11, 12 at stages previous to carrier amplifier 13 and peak amplifier 14, respectively, for compensating the respective amplifiers for the AM-PM distortion characteristic, it is possible to compensate as well for the AM-PM distortion characteristic as the Doherty amplifier, accomplish a low distortion characteristic, and contribute to an ideal operation of the Doherty amplifier.

How the AM-PM distortion characteristic is compensated for in the Doherty amplifier of this embodiment will be described with reference to FIG. 5.

Figure 5:
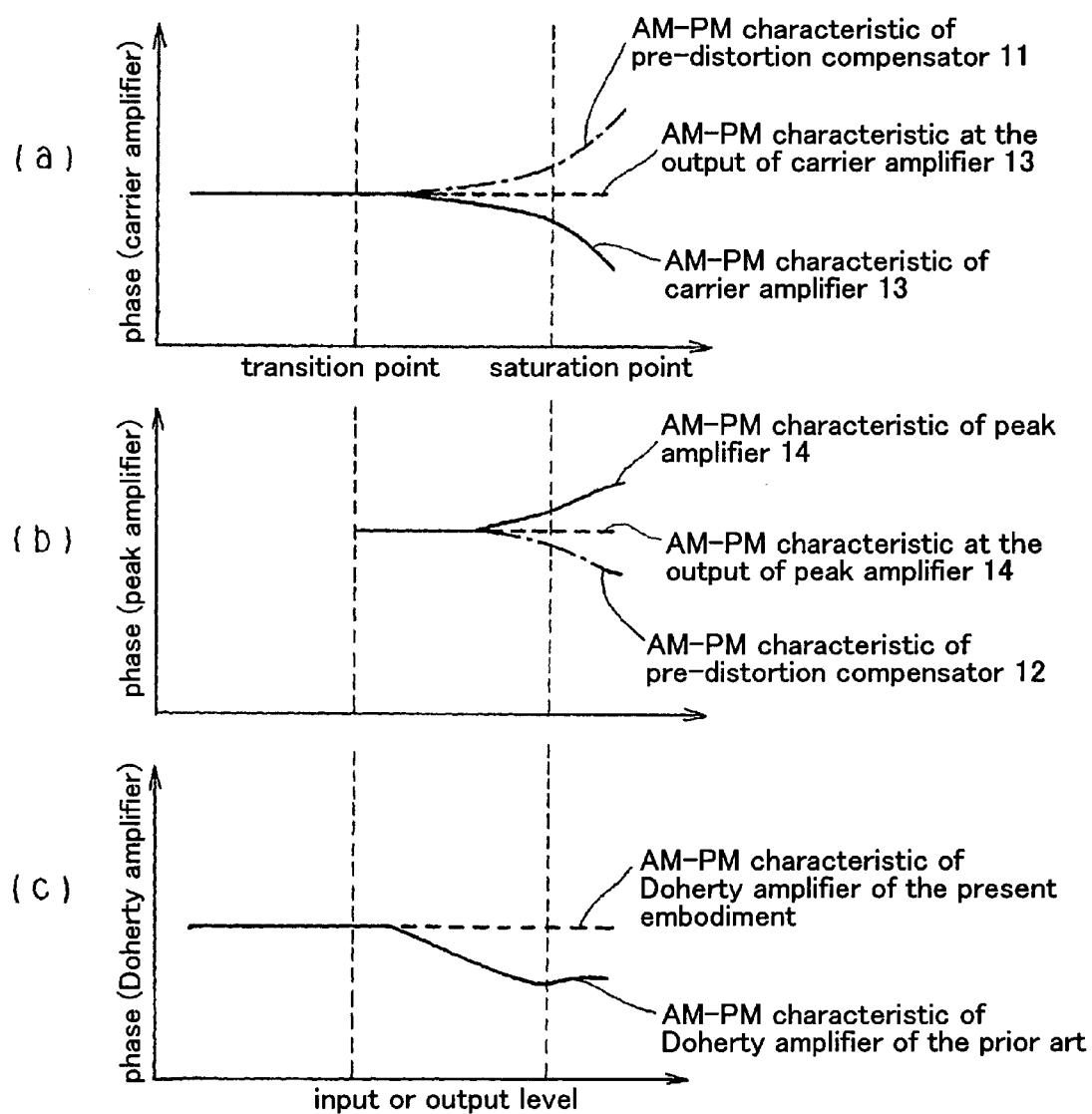
FIG. 5 is a diagram for describing how the AM-PM distortion characteristic is compensated for in the Doherty amplifier according to one embodiment of the present invention.

FIG. 5($a$) is a diagram showing the AM-PM distortion characteristic of pre-distortion compensation circuit 11, the AM-PM distortion characteristic of carrier amplifier 13, and the AM-PM distortion characteristic at the output of carrier amplifier 13. As can be understood when referring to FIG. 5($a$), the AM-PM distortion characteristic of pre-distortion compensation circuit 11 is set to compensate carrier amplifier 13 for the AM-PM distortion characteristic, so that the AM-PM distortion characteristic is compensated for the distortion at the output of the carrier amplifier 13.

Likewise, FIG. 5($b$) is a diagram showing the AM-PM distortion characteristic of pre-distortion compensation circuit 12, the AM-PM distortion characteristic of peak amplifier 14, and the AM-PM distortion characteristic at the output of peak amplifier 14. As can be understood when referring to FIG. 5($b$), the AM-PM distortion characteristic of pre-distortion compensation circuit 12 is set to compensate peak amplifier 14 for the AM-PM distortion characteristic, so that the AM-PM distortion characteristic is compensated for the distortion at the output of peak amplifier 14.

Further, FIG. 5($c$) is a diagram showing the AM-PM distortion characteristic of the Doherty amplifier of this embodiment, and the AM-PM distortion characteristic of a conventional Doherty amplifier, as illustrated in FIG. 1, which is not provided with pre-distortion compensation circuits 11, 12. As can be understood when referring to FIG. 5($c$), in the Doherty amplifier of this embodiment, the AM-PM distortion characteristics are compensated for by pre-distortion compensation circuits 11, 13, respectively, at the output of carrier amplifier 13 and at the output of peak amplifier 14, permitting the AM-PM distortion characteristic to substantially level at the output of the Doherty amplifier. Contrary to this, it can be seen that the AM-PM distortion characteristic in the conventional Doherty amplifier is a combination of the AM-PM distortion characteristic of carrier amplifier 13 with the AM-PM distortion characteristic of peak amplifier 14.

Figure 6:
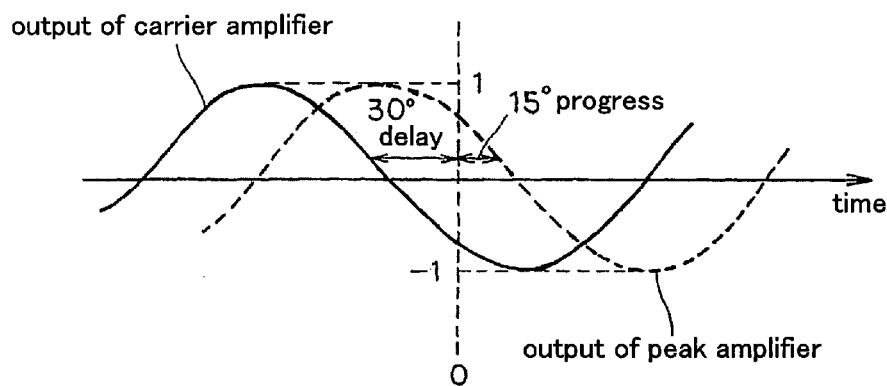
FIG. 6 is a diagram showing an exemplary relationship between an output signal phase of the carrier amplifier and an output signal phase of the peak amplifier.
Figure 7:
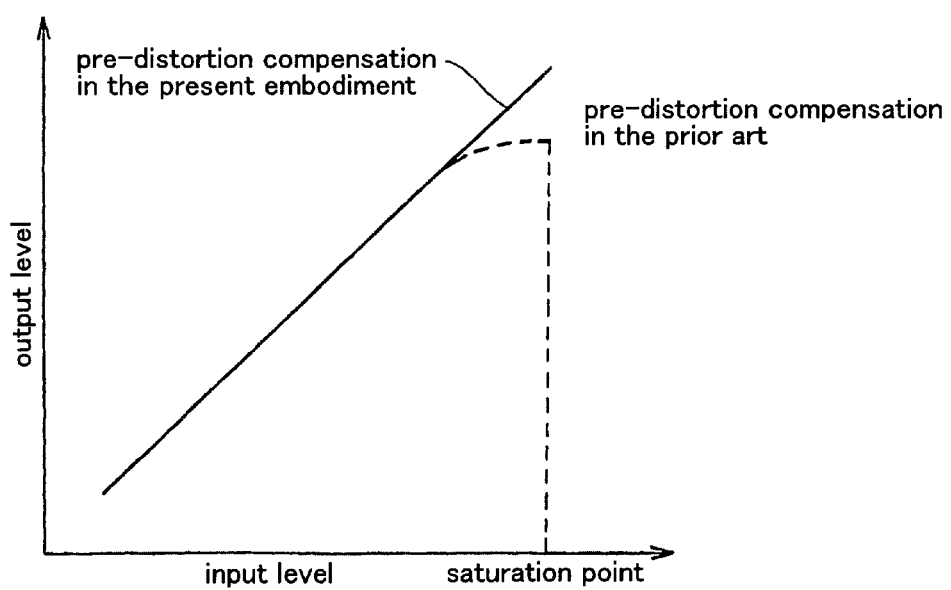
FIG. 7 is a diagram showing the input/output characteristic of the Doherty amplifier when a pre-distortion compensation is performed in accordance with the embodiment and the input/output characteristic of the Doherty amplifier when a pre-distortion compensation is performed in accordance with the prior art.

Next, the relationship between the compensation for the AM-PM distortion and saturated output power of the Doherty amplifier will be described with reference to FIGS. 6 and 7 by way of example. Consider herein a situation in which the conventional Doherty amplifier as illustrated in FIG. 1 is operating near a saturated output. In this event, assume that carrier amplifier 13 is sufficiently operating in a saturation region, with its output signal phase being delayed, for example, by 30° as shown in FIG. 6, while peak amplifier 14 also starts saturated, with its output signal phase being advanced, for example, by 15° as shown in FIG. 6. The respective signal amplitudes are the same because they are operating in saturation, and assume that the signal amplitude is, for example, "1." Thus, the amplitude of a combined output signal generated in this event is calculated by 2×COS (45°/2), and is approximately 1.85. Ideally, the combined amplitude is preferably "2(=1+1)", so that this means that the saturated power is reduced by 0.7 dB. Also, the phase of the combined signal in this event is delayed by 22.5°.

Assume herein that a compensation is made to advance the phase of the saturation point by 22.5° by a prior art pre-distortion compensation which involves disposing a single pre-compensation circuit at a stage previous to the Doherty amplifier. In this event, while the combined output can be compensated for the phase distortion of 22.5°, carrier amplifier 13 and peak amplifier 14 are not compensated for the difference in the AM-PM characteristic therebetween, so that the phase difference is not improved upon combination of output signals, causing combined output to remain lower than an ideal value by approximately 0.7 dB. The input/output characteristic of the Doherty amplifier is indicated by a dotted line in FIG. 7 when such a pre-distortion compensation is performed in accordance with the prior art.

On the other hand, in the Doherty amplifier of this embodiment, carrier amplifier 13 and peak amplifier 14 are compensated for the AM-PM distortion characteristic, respectively, using pre-distortion compensation circuits 11, 12, as shown in FIG. 5, so that the phases of output signals from carrier amplifier 13 and peak amplifier 14 match at a signal combining point. It is therefore understood that this results in a combined amplitude of "2," achievement of ideal saturated output power, and eliminated AM-PM distortion, i.e., improved characteristic. The input/output characteristic of the Doherty amplifier is indicated by a solid line in FIG. 7 when the pre-distortion compensation is performed in accordance with this embodiment.

While the foregoing example has been described in connection with an operation near the saturated output, the basic idea is the same for other operating points, so that detailed description is omitted.

As described above, the Doherty amplifier of this embodiment comprises pre-distortion compensation circuits 11, 12, which have such characteristics that compensate the respective amplifiers for distortions characteristically produced on their operations, at the stages previous to the respective amplifiers. With such a configuration, carrier amplifier 13 can be compensated for the AM-PM distortion characteristic independently of the compensation of peak amplifier 14 for the AM-PM distortion characteristic. It is also possible to produce a distortion reduction effect provided the pre-distortion compensation circuits suitable for the Doherty amplifier, and contribute to an ideal power combining operation of the Doherty amplifier.

While in this embodiment, the pre-distortion amplifiers are disposed at the stages previous to both carrier amplifier 13 and peak amplifier 14, respectively, they can be omitted if distortions produced by the amplifiers can be determined to be relatively small. In other words, the pre-distortion compensation circuits may be disposed at the stage previous to carrier amplifier 13 and at the stage previous to peak amplifier 14, respectively, or the pre-distortion compensation circuit may be disposed at the stage previous to only one of carrier amplifier 13 and peak amplifier 14. Also, in regard to peak amplifier 14, any of pre-distortion compensation circuit 12 and a one-quarter wavelength transmission line in input branching circuit 10 may be arranged at the stage previous to the other, where equivalent improvement effects can be produced as long as the resulting configuration is equivalent to the circuit configuration shown by the foregoing embodiment.

The invention claimed is:

1. A Doherty amplifier having:
    a carrier amplifier which is performing a signal amplifying operation at all times irrespective of an input signal level;
    a peak amplifier which performs an amplifying operation only when the input signal level increases to a certain level or higher to generate high power;
    an output combiner circuit for combining the outputs of said carrier amplifier and said peak amplifier to deliver a combined output; and
    an input branching circuit for distributing an input signal to said carrier amplifier and to said peak amplifier,
    said Doherty amplifier characterized by comprising:
    a first pre-distortion compensation circuit disposed at a stage previous to said carrier amplifier and having such characteristics that compensate said carrier amplifier for a distortion characteristically produced on the operation of said carrier amplifier; and
    a second pre-distortion compensation circuit disposed at a stage previous to said peak amplifier and having such characteristics that compensate said peak amplifier for a distortion characteristically produced on the operation of said peak amplifier.

2. The Doherty amplifier according to claim 1, wherein the distortion compensated for by said first and second pre-distortion compensation circuits is an amplitude-phase distortion.

3. A method of compensating a Doherty amplifier for a distortion characteristic, said Doherty amplifier having a carrier amplifier which is performing a signal amplifying operation at all times irrespective of an input signal level, a peak amplifier which performs an amplifying operation only when the input signal level increases to a certain level or higher to generate high power, an output combiner circuit for combining the outputs of said carrier amplifier and said peak amplifier to deliver a combined output, and an input branching circuit for distributing an input signal to said carrier amplifier and to said peak amplifier, said method comprising the steps of:
    distributing an input signal to said carrier amplifier and to said peak amplifier by said input branching circuit;
    compensating a signal distributed to said carrier amplifier by said input branching circuit for a distortion characteristically produced on the operation of said carrier amplifier;
    compensating a signal distributed to said peak amplifier by said input branching circuit for a distortion characteristically produced on the operation of said peak amplifier;
    amplifying the signal by said carrier amplifier after the signal has been compensated for the distortion characteristically produced on the operation of said carrier amplifier;
    amplifying the signal by said peak amplifier after the signal has been compensated for the distortion characteristically produced on the operation of said peak amplifier; and combining the outputs of said carrier amplifier and said peak amplifier to deliver a combined output.

4. The method of compensating a Doherty amplifier for a distortion characteristic according to claim 3, wherein the distortion characteristically produced on the operation of said carrier amplifier and the distortion characteristically produced on the operation of said peak amplifier are amplitude-phase distortions.

* * * * *